(12) United States Patent
Allen et al.

(10) Patent No.: US 11,049,701 B2
(45) Date of Patent: Jun. 29, 2021

(54) BIASED COVER RING FOR A SUBSTRATE PROCESSING SYSTEM

(71) Applicant: APPLIED MATERIALS, INC., Santa Clara, CA (US)

(72) Inventors: Adolph Miller Allen, Oakland, CA (US); William Johanson, Gilroy, CA (US); Viachslav Babayan, Sunnyvale, CA (US); Zhong Qiang Hua, Saratoga, CA (US); Carl R. Johnson, Tracy, CA (US); Vanessa Faune, San Jose, CA (US); Jingjing Liu, Milpitas, CA (US); Vaibhav Soni, Sunnyvale, CA (US); Kirankumar Savandaiah, Bangalore (IN); Sundarapandian Ramalinga Vijayalaks Reddy, Bangalore (IN)

(73) Assignee: APPLIED MATERIALS, INC., Santa Clara, CA (US)

(*) Notice: Subject to any disclaimer, the term of this patent is extended or adjusted under 35 U.S.C. 154(b) by 420 days.

(21) Appl. No.: 15/823,176

(22) Filed: Nov. 27, 2017

(65) Prior Publication Data
US 2018/0151325 A1 May 31, 2018

Related U.S. Application Data

(60) Provisional application No. 62/426,502, filed on Nov. 26, 2016.

(51) Int. Cl.
*H01J 37/34* (2006.01)
*H01J 37/32* (2006.01)
(Continued)

(52) U.S. Cl.
CPC ...... *H01J 37/3441* (2013.01); *C23C 16/4585* (2013.01); *H01J 37/32477* (2013.01);
(Continued)

(58) Field of Classification Search
CPC ..... C23C 14/34; C23C 14/351; C23C 14/564; C23C 14/0068; C23C 16/4585;
(Continued)

(56) References Cited

U.S. PATENT DOCUMENTS 4,392,938 A    7/1983  Harra et al.
5,421,401 A *  6/1995  Sherstinsky ............ C23C 14/50
                                                    118/728
(Continued)

*Primary Examiner* — Michael A Band
(74) *Attorney, Agent, or Firm* — Moser Taboada

(57) ABSTRACT

Apparatus and methods for reducing and eliminating accumulation of excessive charged particles from substrate processing systems are provided herein. In some embodiments a process kit for a substrate process chamber includes: a cover ring having a body and a lip extending radially inward from the body, wherein the body has a bottom, a first wall, and a second wall, and wherein a first channel is formed between the second wall and the lip; a grounded shield having a lower inwardly extending ledge that terminates in an upwardly extending portion configured to interface with the first channel of the cover ring; and a bias power receiver coupled to the body and extending through an opening in the grounded shield.

19 Claims, 4 Drawing Sheets

(51) Int. Cl.
  *C23C 14/34* (2006.01)
  *C23C 16/458* (2006.01)
  *H01J 37/02* (2006.01)

(52) U.S. Cl.
  CPC .. *H01J 37/32642* (2013.01); *H01J 37/32651* (2013.01); *H01J 37/3411* (2013.01); *C23C 14/34* (2013.01); *H01J 37/026* (2013.01)

(58) Field of Classification Search
  CPC .. C23C 14/04; C23C 14/042; H01J 37/32477; H01J 37/32623; H01J 37/32651; H01J 37/32642; H01J 37/026; H01J 37/3441; H01J 37/3411; H01J 37/3488; H01L 21/68721; H01L 21/68714; H01L 21/3065; Y10T 428/12528
  See application file for complete search history.

(56) References Cited

U.S. PATENT DOCUMENTS

| | | | | |
|---|---|---|---|---|
| 5,473,117 A | * | 12/1995 | Morgan | H01R 4/646 |
| | | | | 174/74 R |
| 7,252,737 B2 | * | 8/2007 | Brown | H01J 37/321 |
| | | | | 118/728 |
| 2014/0263169 A1 | * | 9/2014 | Lee | H01J 37/32091 |
| | | | | 216/37 |

* cited by examiner

BIASED COVER RING FOR A SUBSTRATE PROCESSING SYSTEM

CROSS-REFERENCE TO RELATED APPLICATIONS

This application claims the benefit of U.S. Provisional Patent Application No. 62/426,502, filed with the United States Patent Office on Nov. 26, 2016, which is herein incorporated by reference in its entirety.

FIELD

Embodiments of the present disclosure generally relate to substrate processing equipment.

BACKGROUND

Conventionally, physical vapor deposition (PVD) equipment is used to produce thick and dense films for example, for use as a hard mask layer in substrate patterns used in applications that rely on vertical stacking. Typically, the thick and dense PVD films are deposited with sputtering methods using one or a combination of RF, DC, or pulsed DC based discharge. However, the inventors have discovered that, in certain applications, substrates processed with the current PVD sputtering methods often produce an accumulation of excessive amounts of charged particles that undesirably lead to increases in defects in deposited films.

Therefore, the inventors have provided improved apparatus and methods for processing substrates in a plasma enhanced substrate processing processing system.

SUMMARY

Apparatus and methods for reducing and eliminating accumulation of excessive charged particles from substrate processing systems are provided herein. In some embodiments a process kit for a substrate process chamber includes: a cover ring having a body and a lip extending radially inward from the body, wherein the body has a bottom, a first wall, and a second wall, and wherein a first channel is formed between the second wall and the lip; a grounded shield having a lower inwardly extending ledge that terminates in an upwardly extending portion configured to interface with the first channel of the cover ring; and a bias power receiver coupled to the body and extending through an opening in the grounded shield.

In some embodiments, a process chamber includes: a substrate support disposed within an inner volume of the process chamber, the substrate support having a deposition ring disposed atop the substrate support; and a process kit disposed about the substrate support, wherein at least a portion of the process kit is disposed above a substrate supporting surface of the substrate support. The process kit can include: a cover ring having a body and a lip extending radially inward from the body, wherein the body has a bottom, a first wall, and a second wall, and wherein a first channel is formed between the second wall and the lip; a grounded shield having a lower inwardly extending ledge that terminates in an upwardly extending portion configured to interface with the first channel of the ring; a bias power receiver disposed below the lower inwardly extending ledge, coupled to the body, and extending through an opening in the grounded shield; and a conductive element disposed below the bias power receiver. A conductive rod is disposed through a wall of the process chamber and coupled to the conductive element to provide power to the cover ring from a bias power source.

In some embodiments, a substrate processing system includes: a process chamber having an inner volume; a target assembly disposed in the inner volume and comprising a material to be sputtered; a substrate support disposed within the inner volume; an RF power source coupled to the target assembly; and a process kit disposed about the substrate support, wherein at least a portion of the process kit is disposed above a substrate supporting surface of the substrate support. The process kit can include: a cover ring having a body and a lip extending radially inward from the body, wherein the body has a bottom, a first wall, and a second wall, and wherein a first channel is formed between the second wall and the lip; a grounded shield having a lower inwardly extending ledge that terminates in an upwardly extending portion configured to interface with the first channel of the ring; a bias power receiver disposed below the lower inwardly extending ledge, coupled to the body, and extending through an opening in the grounded shield; and a conductive element disposed below the bias power receiver, wherein the bias power receiver contacts the conductive element at least when the cover ring is not resting on the grounded shield. A first RF bias power source is provided to provide a negative voltage bias to the substrate support; a second RF bias power source is provided to provide a positive voltage bias to the cover ring; and a conductive rod disposed through an electrical feedthrough on a wall of the process chamber, wherein the conductive rod electrically couples the conductive element to the second RF bias power source.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
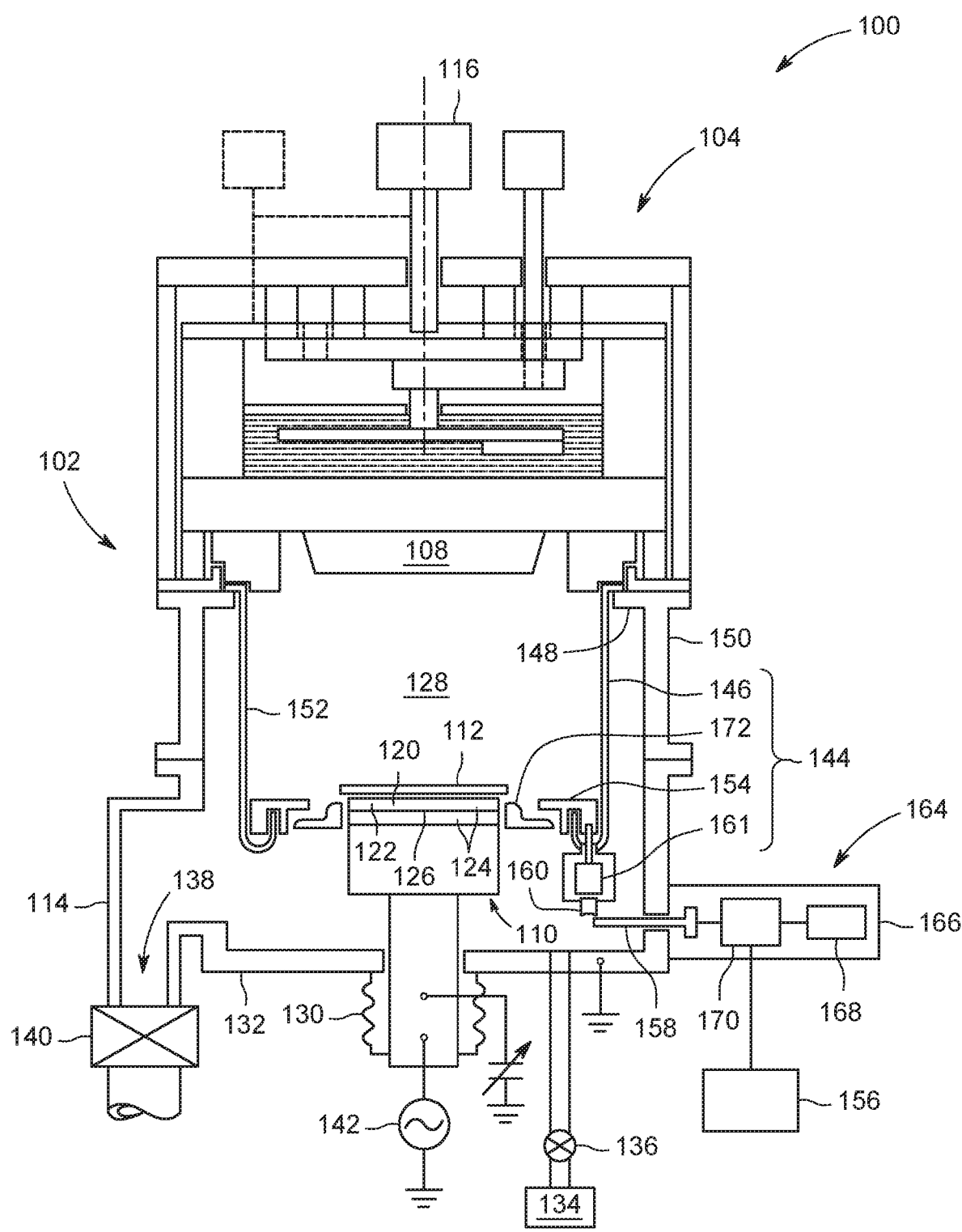
FIG. 1 depicts a schematic view of process chamber having a process kit in accordance with one or more embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation

DETAILED DESCRIPTION

Embodiments of the present disclosure provide apparatus and methods for improved reduction of excessive charged particles on a substrate or wafer processed in a plasma enhanced substrate process chamber. The disclosed methods and apparatus advantageously facilitate redirecting charged plasma particles away from a substrate support having a substrate or wafer disposed thereon, thus advantageously reducing or eliminating excessive accumulation of particles on the processed substrate or wafer, increasing film uniformity, and reducing film defects.

FIG. 1 depicts a simplified, cross-sectional view of a PVD chamber in accordance with one or more embodiments of the present disclosure. Examples of PVD chambers suitable for modification in accordance with the teachings provided herein include the ALPS® Plus and SIP ENCORE® PVD processing chambers, both commercially available from Applied Materials, Inc., of Santa Clara, Calif. Other processing chambers from Applied Materials, Inc. or other manufactures, including those configured for other types of processing besides PVD, may be also adapted to benefit from the present disclosure.

In some embodiments, the substrate processing system 100 includes a process chamber 102 having a chamber lid 104 disposed atop the process chamber 102. The chamber lid 104 may include a target assembly and a grounding assembly. The process chamber 102 contains a substrate support 110 for receiving a substrate 112 thereon. The substrate support 110 may be located within a lower grounded enclosure wall 114, which may be a chamber wall of the process chamber 102. The lower grounded enclosure wall 114 may be electrically coupled to the grounding assembly of the chamber lid 104 such that an RF return path is provided to a RF power source 116 disposed above the chamber lid 104. Alternatively, other RF return paths are possible, such as those that travel from the substrate support 110 via a process kit shield (e.g. a grounded shield 144 as discussed below) and ultimately back to the grounding assembly of the chamber lid 104.

The RF power source 116 is configured to provide RF power to the target assembly. In some embodiments, the first RF bias power source 142 may deliver pulsed RF energy to the target assembly. For example, in some embodiments, the RF energy supplied by the RF power source 116 may be adapted for performing High Impulse Pulsed Magnetron Sputtering (HIPIMS), a method characterized by very high voltage, high current short duration pulse waveforms that result in a high ionization rate of the sputtered target material.

The target assembly includes a target 108. The target 108 may comprise a source material to be deposited on a substrate, such as the substrate 112 during sputtering, such as a metal, metal oxide, metal alloy, or the like.

The substrate support 110 has a material-receiving surface facing a principal surface of the target 108 and supports the substrate 112 to be sputter coated in a planar position opposite to the principal surface of the target 108. The substrate support 110 may include a dielectric member 120 having a substrate supporting surface 122 for supporting the substrate 112 thereon. In some embodiments, the substrate support 110 may include one or more first conductive members 124 disposed below the dielectric member 120 and having a dielectric member facing surface 126 adjacent to the dielectric member 120. For example, the dielectric member 120 and the one or more first conductive members 124 may be part of an electrostatic chuck, RF electrode, or the like which may be used to provide chucking or RF power to the substrate support 110.

The substrate support 110 may support the substrate 112 in a first volume 128 of the process chamber 102. The first volume 128 may be a portion of the inner volume of the process chamber 102 that is used for processing the substrate 112 and may be separated from the remainder of the inner volume (e.g., a non-processing volume) during processing of the substrate 112. The first volume 128 is defined as the region above the substrate support 110 during processing (for example, between the target 108 and the substrate support 110 when in a processing position).

In some embodiments, the substrate support 110 may be vertically movable to allow the substrate 112 to be transferred onto the substrate support 110 through a load lock valve (not shown) in the lower portion of the process chamber 102 and thereafter raised to a deposition, or processing position. A bellows 130 connected to a bottom chamber wall 132 may be provided to maintain a separation of the inner volume of the process chamber 102 from the atmosphere outside of the process chamber 102. One or more gases may be supplied from a gas source 134 through a flow control element 136 (such as a mass flow controller, or the like) into the lower part of the process chamber 102. An exhaust port 138 may be provided and coupled to a pump (not shown) via a valve 140 for exhausting the interior of the process chamber 102 and to facilitate maintaining a desired pressure inside the process chamber 102.

A first RF bias power source 142 may be coupled to the substrate support 110 in order to induce a negative DC bias on the substrate 112. In addition, in some embodiments, a negative DC self-bias may form on the substrate 112 during processing. For example, RF energy supplied by the first RF bias power source 142 may range in frequency from about 2 MHz to about 60 MHz, for example, non-limiting frequencies such as 2 MHz, 13.56 MHz, or 60 MHz can be used.

In some embodiments, the first RF bias power source 142 may deliver pulsed RF energy to induce a pulsed negative DC bias on the substrate 112. In some embodiments, the first RF bias power source 142 may deliver constant RF energy to induce a constant negative DC bias on the substrate 112.

In other applications, the substrate support 110 may be grounded or left electrically floating. Alternatively or in combination, a capacitance tuner may be coupled to the substrate support 110 for adjusting voltage on the substrate 112 for applications where RF bias power may not be desired.

The process chamber 102 further includes a process kit 144, including a grounded shield 146 to surround the processing, or first volume 128 of the process chamber 102 and to protect other chamber components from damage and/or contamination from processing. In some embodiments, the grounded shield 146 may be connected to a ledge 148 of an upper grounded enclosure wall 150 of the process chamber 102. As illustrated in FIG. 1, the chamber lid 104 may rest on the ledge 148 of the upper grounded enclosure wall 150. Similar to the lower grounded enclosure wall 114, the upper grounded enclosure wall 150 may provide a portion of the RF return path between the lower grounded enclosure wall 114 and the grounding assembly of the chamber lid 104. However, other RF return paths are possible, such as via the grounded shield 146.

The grounded shield 146 extends downwardly and may include one or more sidewalls 152 configured to surround the first volume 128. The grounded shield 146 extends along the walls of the upper grounded enclosure wall 150 and the lower grounded enclosure wall 114 downwardly to below a top surface of the substrate support 110 and returns upwardly until reaching a top surface of the substrate support 110 (e.g., forming a u-shaped portion at the bottom of the grounded shield 146).

The process kit 144 further includes a first ring 154 (e.g., a cover ring). The first ring 154 can be conductive and can be fabricated of suitable process compatible conductive materials, such as stainless steel. The first ring 154 rests on the top of the u-shaped portion of the grounded shield 146 (e.g., a first position of the first ring 154) when the substrate support 110 is in a lower, loading position (not shown) but rests on the outer periphery of the substrate support 110 (e.g., a second position of the first ring 154) when the substrate support 110 is in an upper, deposition position (as illustrated in FIG. 1) to protect the substrate support 110 from sputter deposition. Although discussed above as the substrate support 110 being moveable relative to the grounded shield 146 and the first ring 154, in some embodiments, the substrate support 110 is stationary and the grounded shield 146 and the first ring 154 are moveable relative to the substrate support 110.

As shown in FIG. 1, a second RF bias power source 156 may be coupled to the first ring 154. In some embodiments, the second RF power source may be configured to induce a positive DC bias on the first ring 154. In some embodiments, the second RF bias power source 156 may be configured to provide a constant positive RF bias to the first ring 154. In some embodiments, the second RF bias power source 156 may be configured to provide a positive DC bias in synchronization with the negative DC bias power supplied to the substrate support 110 by the first RF bias power source 142. In some embodiments, the second RF bias power source 156 may be configured to provide a positive DC bias out of synchronization with the negative DC bias power supplied to the substrate support 110 by the first RF bias power source 142. In some embodiments, the positive DC bias delivered by the second RF bias power source 156 comprises a high current and a low voltage. For example, in some embodiments, the current delivered by the second RF bias power source 156 may be in the order of about 40 Amperes to about 50 Amperes.

In some embodiments, as depicted in FIG. 1, the first ring 154 may be coupled to the second RF bias power source 156 via a conductive rod 158 (e.g., a copper rod). The conductive rod 158 has a first end and a second end. A conductive element 160 couples the first end of the conductive rod 158 to the first ring 154 via a bias power receiver 161 coupled to an interior portion (not shown) of the first ring 154.

The conductive element 160 is configured to maintain an electrical connection between the conductive rod 158 and the first ring 154. For example, the conductive element 160 maintains an electrical connection between the conductive rod 158 and the first ring 154 when the first ring 154 is in the first position, and when the first ring 154 is in the second position. In some embodiments, the conductive element 160 may be flexible. For example, in some embodiments, the conductive element 160 may comprise a leaf spring.

The conductive element 160 is configured to carry bias power signals having a high current and a low voltage. For example, in some embodiments, the conductive element is configured to carry bias power signals having a current between about 40 amperes and about 50 amperes. The conductive element 160 can be fabricated from a suitable process-compatible conductive material, such as stainless steel.

In some embodiments, the second end of the conductive rod 158 may extend out of a feedthrough hole 162 disposed on a wall the process chamber 102 to couple the first ring 154 to an external circuit 164. The external circuit 164 is coupled to and receives power from the second RF bias power source 156. In some embodiments, the external circuit 164 may be directly coupled between the second end of the conductive rod 158 and the second RF bias power source 156. In some embodiments, external circuit 164 may be housed in an electrical enclosure 166. As depicted in FIG. 1, the electrical enclosure 166 may be disposed on a wall of the process chamber 102, about the second end of the conductive rod 158 and about the feedthrough hole 162.

In some embodiments, the external circuit 164 includes a first filter 168 to block RF signals from interfering with the positive bias power delivered to the first ring 154. For example, in some embodiments, the first filter 168 may be a low pass filter provided to block RF signals having a frequency of about 13.56 MHz that may be present in the process chamber 102 relative to the RF energy provided to the substrate support 110. In some embodiments, the first filter 168 may be provided filter RF energy signals due to a source pulsed DC. For example, the first filter may be configured to block pulsed DC signals having a frequency of about 4 kHz to about 40 kHz.

The external circuit 164 has a second filter 170 including at least an inductor and a capacitor. In some embodiments, the second filter 170 may be a low pass filter configured to block pulsed DC signals having a frequency of about 0.0625 Hz from interfering with the positive bias power delivered to the first ring 154. In some embodiments, a single connection is provided between the second RF bias power source 156 and the first ring 154. In some embodiments, a plurality of connections, such as two connections or three connections or more, are provided between the second RF bias power source 156 and the first ring 154. In some embodiments, a plurality of connections, such as two connections or three connections or more, are provided between individual respective RF bias sources (each configured as the second RF bias power source 156) and the first ring 154. In embodiments with multiple bias connections to the first ring 154, the connections can be equidistantly spaced about the first ring 154, such as at about 180 degrees for two connections, about 120 degrees for three connections, and the like.

In some embodiments, the process kit 144 may include a dielectric ring 172 (e.g., a deposition ring) may be used to shield the periphery of the substrate 112 from deposition. For example, the dielectric ring 172 may be disposed about a peripheral edge of the substrate support 110 and adjacent to the substrate supporting surface 122 as illustrated in FIG. 1. In some embodiments, the dielectric ring 172 may shield exposed surfaces of the one or more first conductive members 124 as shown.

In some embodiments, the dielectric ring 172 may be configured to electrically isolate the substrate support 110 from the first ring 154. Therefore, in some embodiments, the thickness of the dielectric ring 172 may influence the amount of the positive bias voltage that may be supplied to the first ring 154. In some embodiments, the dielectric ring 172 is electrically floating relative to the other components of the process kit 144. In some embodiments, the dielectric ring 172 may be made of ceramic or other suitable process-compatible dielectric material.

Optionally, the substrate support 110 may include a second conductive member (not shown) to facilitate an RF return path between the substrate support 110 and the grounded shield 146. In some embodiments, the second conductive member may be disposed about and in contact with the one or more first conductive members 124.

In some embodiments, the process chamber may include a collimator (not shown) disposed between the target 108 and the substrate support 110. In some embodiments, the collimator may be disposed closer to the substrate support 110 than to the collimator. In some embodiments, the collimator may be disposed closer to the target 108 than to the substrate support 110.

Figure 2:
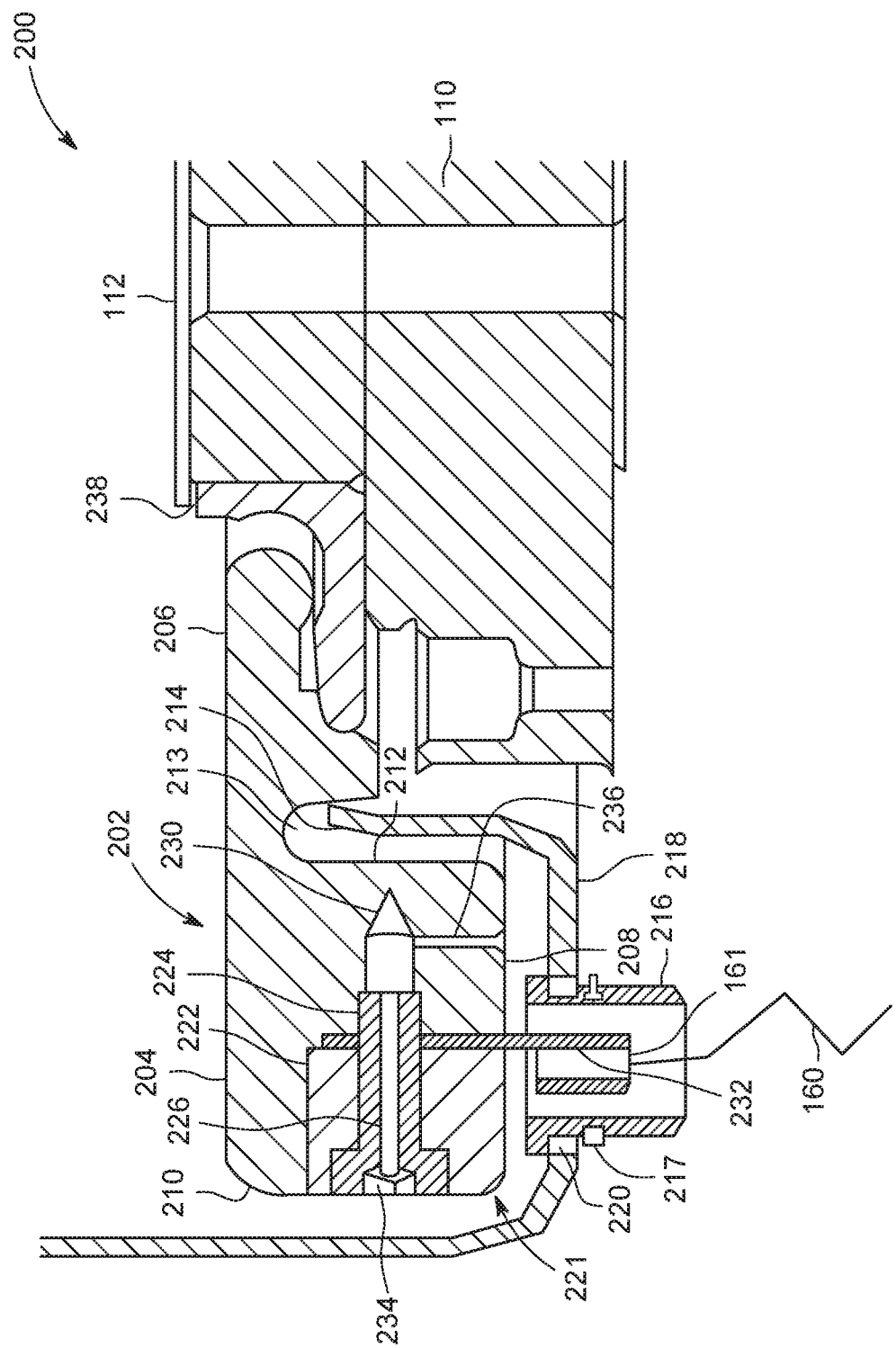
FIG. 2 depicts a partial schematic cross-section of an exemplary process kit in accordance with one or more embodiments of the present disclosure.

FIG. 2 depicts a partial schematic cross-section of an exemplary process kit in accordance with one or more embodiments of the present disclosure.

In some embodiments, for example, the exemplary process kit 200 includes a first ring 154, for example, cover ring 202 depicted in FIG. 2. The cover ring 202 has a body 204 and a lip 206 extending radially from the body 204. The body 204 includes a bottom 208, a first wall 210, and a second wall 212. A first channel 213 is formed between the second wall 212 and the lip 206.

As shown in FIG. 2, the first channel 213 interfaces with a top surface of an inner side 214 (vertical side of lower inwardly extending ledge that terminates in an upwardly extending portion) in of the u-shaped portion of the grounded shield 146. The top surface of the inner side 214 is configured to receive and solely support the cover ring 202, for example, when the substrate support 110 is in a lowered position. In some embodiments, the inner side 214 may be substantially vertical. In some embodiment, for example, as shown in FIG. 2, the inner side 214 may include a slanted portion. The cover ring 202 can also be solely supported by the dielectric ring 172 (e.g., a deposition ring), for example, when the substrate support is in a raised position, such as depicted in FIG. 2.

The cover ring 202 is coupled to the bias power receiver 161. In some embodiments, a housing 216 may be disposed about the bias power receiver 161 and through the bottom 208 and a base 218 (bottom of lower inwardly extending ledge that terminates in an upwardly extending portion) of u-shaped portion the grounded shield 146.

In some embodiments, the housing 216 may be made of a dielectric material. In some embodiments, the housing 216 may be tubular, for example, cylindrical. In some embodiments, the housing 216 may be made from two or more blocks held together by one or more clamping members 217.

In some embodiments, one or more insulating members 220 may be disposed about the housing 216 to maintain insulation between the grounded shield 146 and the cover ring 202 when the cover ring 202 is raised off of the grounded shield 146.

In some embodiments, an interior structure 221 having a first block 222 (e.g., a clamp block) may be inserted into the body 204 proximate the first wall 210. The interior structure 221 provides ultimate electrical coupling between the body 204 of the cover ring 202 and the second RF bias power source 156.

In some embodiments, the body 204 further includes a torsional member 224 having a back end disposed in the first wall 210. A front end of the torsional member 224 is disposed through the first block 222 and is coupled to a receiving feature 230 (e.g., a threaded opening) of the body 204 proximate the second wall 212. In some embodiments, for example, as depicted in FIG. 2, the torsional member 224 is disposed perpendicular to the central vertical axis of the process chamber. In some embodiments, the torsional member 224 may be a threaded bolt disposed through the first block 222 and into the body 204.

A conductive path 232 is provided between the first block 222 and the body 204. The conductive path 232 extends from the interior structure 221 through the bottom 208 and the housing 216 disposed through the base 218 to form an electrical connection with the bias power receiver 161 disposed in the housing 216.

In some embodiments, the torsional member 224 may include a head 234, for example, a fastener disposed in the first wall 210 adapted to receive a tool for rotating the torsional member 224. Applying torsional force to the torsional member 224 moves the first block 222 closer the body 204 to provide robust contact with the conductive path 232 and maintain an electrical connection between the cover ring 202 and the bias power receiver 161.

In some embodiments, the cover ring 202 may include one or more vents, for example, vent passageway 236 formed in the supporting member 228, and/or vent passageway 226 formed in the torsional member 224. The one or more vents, for example, the vent passageways 226, 236 are provided for removing gases that may be trapped within the interior structure 221, for example, within the receiving feature 230 when the torsional member 224 is present.

In some embodiments, the cover ring 202 may have a geometry adapted for tracking and trapping particles away from the substrate 112 placed on the substrate support 110 during plasma processing. In some embodiments, the first ring may have a radially outwardly sloping exposed surface. For example, in some embodiments, the radially outward sloping exposed surface may be disposed tilted at an angle of about 10 degrees or about 20 degrees.

In some embodiments, in some embodiments, a gap 238 is defined between the cover ring 202 and the substrate 112. The gap 238 is provided to reduce arcing between the cover ring 202 and the substrate 112 during processing. For example, in some embodiments, the gap 238 may be about 5 mm wide.

In some embodiments, magnetic elements may be embedded into the body of the cover ring 202. In some embodiments, the magnetic field may be configured to create a cross-field with the electric field such that particles moving towards the cover ring have are forced into a trajectory that is perpendicular to both the electric and magnetic fields.

Figure 3:
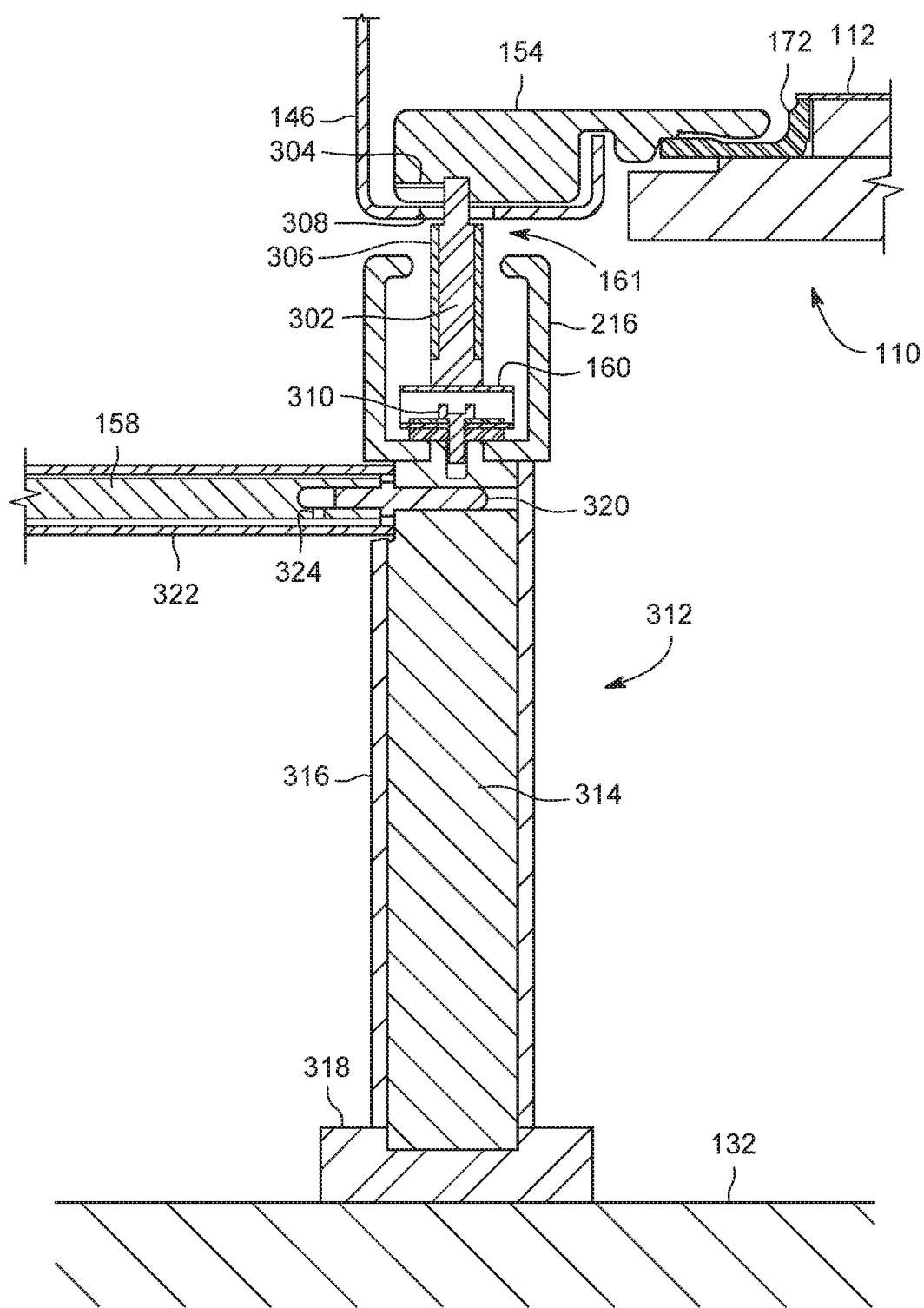
FIG. 3 depicts a partial schematic cross-section of an exemplary process kit in accordance with one or more embodiments of the present disclosure.
Figure 4:
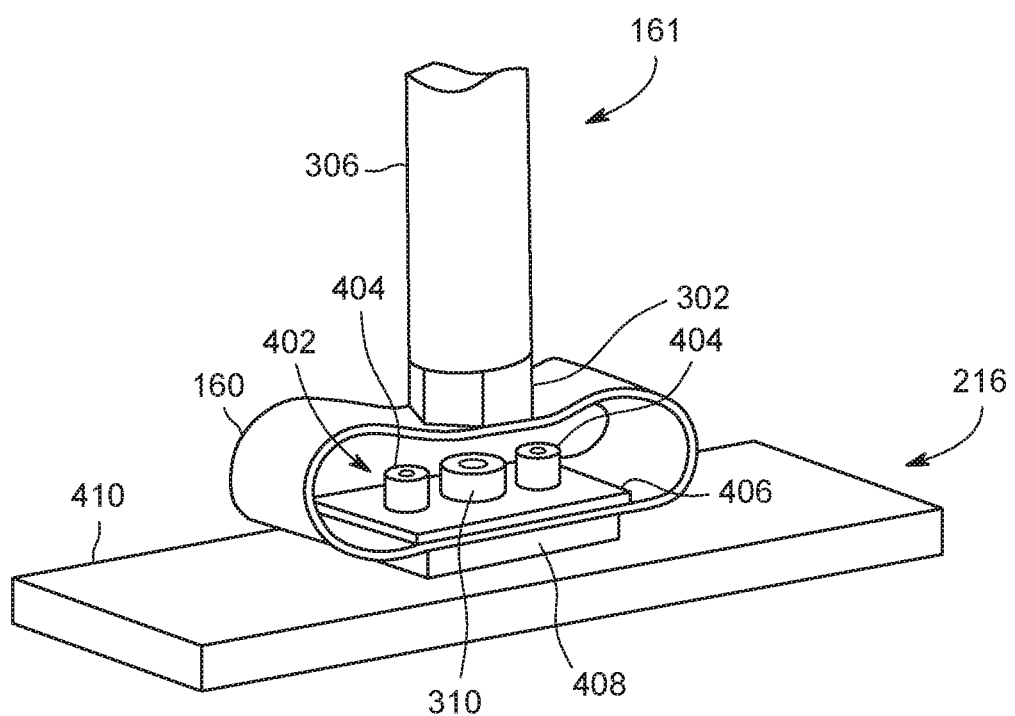
FIG. 4 depicts an isometric partial detail view of a portion of the process kit of FIG. 3 in accordance with one or more embodiments of the present disclosure.

FIG. 3 depicts a partial schematic cross-section of an exemplary process kit in accordance with some embodiments of the present disclosure. FIG. 4 depicts an isometric partial detail view of a portion of the process kit of FIG. 3. To the extent not inconsistent with FIGS. 1 and 2, details disclosed with respect to FIGS. 3 and 4 may be incorporated into the apparatus discussed above with respect to FIGS. 1 and 2. For ease of understanding and brevity of disclosure, identical or corresponding components or structure identified in FIGS. 1 and 2 retain their numbering in FIGS. 3 and 4.

As shown in FIG. 3, the exemplary process kit includes the first ring 154 (e.g., a cover ring, or cover ring 202). The first ring 154 may have an outer surface geometry similar to that described with respect to the cover ring 202, although other geometries can also be used. The first ring 154 is configured to rest solely on the grounded shield 146 (for example, on the upwardly extending portion of the u-shaped portion of the grounded shield 146), for example, when the substrate support 110 is in a lowered position. The first ring 154 is further configured to rest solely on the dielectric ring 172 (e.g., a deposition ring), for example, when the substrate support 110 is in a raised position (such as depicted in FIG. 3).

The first ring 154 is coupled to the bias power receiver 161. In some embodiments, the bias power receiver 161 can include a conductive pin 302 (e.g., a titanium pin, a stainless steel pin, or the like). For example, the conductive pin 302 may include an end inserted into a corresponding opening in the first ring 154. In some embodiments, the end of the conductive pin 302 can be threaded and coupled to the first ring 154 via mating threads formed in the opening in the first ring 154. A vent passageway 304 may be provided within the first ring 154 between the opening and an outer surface of the first ring 154 to reduce or eliminated trapped air within the opening of the first ring 154 when the conductive pin 302 is inserted into the opening of the first ring 154. The conductive pin 302 can also include a dielectric outer covering 306. The dielectric outer covering 306 can be fabricated of any process-compatible dielectric materials, such as ceramic, for example, aluminum oxide. The conductive pin 302 extends away from the first ring 154, for example, in a downward direction through an opening 308 in a lower portion of the grounded shield 146 (such as a bottom portion of the u-shaped portion of the grounded shield 146). Such a configuration facilitates movement of the first ring 154 with respect to the grounded shield 146 with a minimally sized opening 308 to accommodate the conductive pin 302 extending through the grounded shield 146.

In some embodiments, a housing 216 may be disposed about the bias power receiver 161, and in particular, the conductive pin 302. The housing 216 can be made of a dielectric material (such as a ceramic, for example aluminum oxide). In some embodiments, the housing 216 may be made from a singular piece of material. Alternatively, the housing 216 may be made from two or more pieces held together, for example, by one or more of clamps, bolts, welding, or the like.

The housing 216 can further enclose the conductive element 160 that couples the first end of the conductive rod 158 to the first ring 154 via the bias power receiver 161. For example, the conductive element 160 can be a loop of conductive material, such as stainless steel, coupled to the bottom of the housing 216. The conductive element 160 can be coupled to the bottom of the housing by any suitable fastener, for example, clamps, bolts, or the like. For example, as shown in greater detail in FIG. 4, the conductive element 160 can be coupled to a base 410 of the housing 216. The conductive element 160 can be coupled to the base 410 using one or more fasteners 402. In some embodiments, one or more screws 404 (two shown in FIG. 4), may be used to couple the conductive element 160 between two assembly plates 406, 408. A screw 310 may be used to couple the conductive element 160 and assembly plates 406, 408 to a stable locating pillar (e.g., 312 in FIG. 3).

Returning to FIG. 3, the housing 216 can be stably be positioned in the process chamber in a desired location to surround the conductive pin 302 and the conductive element 160. As depicted in FIG. 3, a pillar 312 may be coupled to the process chamber (such as to the bottom chamber wall 132) to provide a stable base for maintaining position of the conductive element 160. The pillar 312 may also provide a stable location for coupling the conductive element 160 to the conductive rod 158. In some embodiments, the pillar 312 may include a conductive post 314 (e.g., a copper post) with a dielectric outer covering 316 (e.g., a ceramic, such as an aluminum oxide outer covering). A dielectric base 318 (such as fabricated from ceramic, for example aluminum oxide) can be provided between the conductive post 314 and the grounded chamber surface to which the conductive post 314 is coupled (e.g., the bottom chamber wall 132).

The conductive element 160 (and the housing 216), can be coupled to the pillar 312 in any suitable fashion, such as by clamps, bolts, screws, or the like. In FIG. 3, a screw 310 is shown coupling the conductive element 160 and the housing 216 to the conductive post 314 of the pillar 312.

The conductive rod 158 is coupled to the conductive element 160. In some embodiments, and as depicted in FIG. 3, the conductive rod 158 is coupled to the conductive element 160 through the pillar 312. For example, the conductive rod 158 can be coupled to the conductive post 314 of the pillar 312. In some embodiments, a conductive coupler 320, such as a banana plug, is inserted at one end into an opening in an end of the conductive rod 158 and, at the opposite end, into an opening in the conductive post 314. A vent opening 324 can be provided in the conductive rod 158 and a vent opening 326 can be provided in the conductive post 314 to minimize or eliminate trapped gases during assembly. The conductive rod 158 can also include a dielectric outer covering 322 (e.g., a ceramic, such as an aluminum oxide outer covering). The conductive rod 158 is coupled to a power supply, for example, as discussed above with respect to FIG. 1.

In operation, as illustrated in FIG. 1, the RF power source 116 provides a first bias power to the target 108 and the target 108 ejects source material to be deposited on a substrate 112 disposed on the substrate support 110. For example, in some embodiments, the target source material may be carbon or silicon, or the like. One or more gases may be supplied from the gas source 134 to the first volume 128 to form a plasma therein. For example, in some embodiments, the one or more gases may include a sputtering gas, for example, krypton gas. The first RF bias power source 142 provides a negative DC bias voltage to the substrate support 110 to negatively bias the substrate 112 disposed thereon for processing. The negative DC voltage bias applied to the substrate 112 attracts positively charged plasma particles of the source material to deposit and form a film on the substrate 112.

However, the inventors have discovered that some of the source material particles may aggregate within the plasma to form a cloud or nucleus of particles having an electronegative net charge. The inventors have observed that the gas phase aggregation of electro-negatively charged particles may also deposit on the substrate causing an excessive accumulation of charged source material particulates and substrate film contamination. The inventors have observed particle traces on processed substrates and wafers, suggesting the presence of charged particles. In some embodiments, for example, the excess accumulated source material particulates may be carbon dust, or carbon including krypton gas or the like.

Therefore, the inventors have discovered that by providing a cover ring, for example the cover ring 202 and applying a positive DC bias thereto, the growth of the electro-negatively charged particle may be mitigated by steering the aggregated particles, having a negative net charge, away from the plasma and trapping them in and on the surfaces of the positively biased cover ring 202. For example, ins some embodiments, the cover ring 202 provides a positively charged surface such that the negatively charged particles levitating in the plasma end up on the positively charged surface of the cover ring 202 rather than on the substrate 112.

As depicted in FIGS. 1-4, for example, the positive bias power on the cover ring 202 is provided by the second RF bias power source 156 coupled to the cover ring 202. The bias power received by the bias power receiver 161 is delivered to the cover ring 202 via, an electrical path through the external circuit 164, the conductive rod 158, and the conductive element 160. The primary return path of the power delivered to the cover ring 202 is through the plasma to the grounded shield 146.

In some embodiments, the positive bias power applied to the cover ring 202 may have a high current and a relatively low voltage. For example, in some embodiments, the positive bias power may have about 40 amperes to about 50 amperes. In some embodiments, the amount of positive bias voltage applied to the cover ring 202 may be selected based on parameters such as the size and mass of the negatively charged particles to be attracted out of the plasma. In some embodiments, the amount of positive bias voltage applied to the cover ring 202 is sufficient to overcome a net negative plasma potential containing the electronegative source particle cloud. However, the applied positive bias voltage may have an upper limit because if the bias voltage is excessive, arcing may occur between the cover ring 202 and the substrate 112 disposed on the substrate support 110. In some embodiments, arcing events may be reduced by maintaining the gap 238 between the cover ring 202 and the substrate 112 sufficiently large.

While the foregoing is directed to embodiments of the present disclosure, other and further embodiments of the disclosure may be devised without departing from the basic scope thereof.

The invention claimed is:

1. A process kit for a substrate process chamber, comprising:
   a cover ring having a body and a lip extending radially inward from the body, wherein the body has a bottom, a first wall, and a second wall, and wherein a first channel is formed between the second wall and the lip;
   a grounded shield having one or more sidewalls configured to surround a processing space and a base that includes a lower inwardly extending ledge that terminates in an upwardly extending portion configured to interface with the first channel of the cover ring; and
   a bias power receiver coupled to the bottom of the body and extending through an opening in the base of the grounded shield such that the bias power receiver does not directly contact the grounded shield; and
   a dielectric housing disposed about the bias power receiver.

2. The process kit of claim 1, further comprising the dielectric housing disposed through the opening in the base of the grounded shield.

3. The process kit of claim 1, wherein one or more insulating members are disposed about the dielectric housing to maintain insulation between the grounded shield and the cover ring when the cover ring is raised off of the grounded shield.

4. The process kit of claim 1, further comprising a conductive path extending from the body into the dielectric housing to form an electrical connection with the bias power receiver.

5. The process kit of claim 4, wherein the cover ring comprises a first block coupled to the body by a torsional member and spaced from the grounded shield, and wherein the conductive path is disposed between the first block and the body.

6. The process kit of claim 5, wherein the torsional member includes a fastener disposed through the first block and into the body.

7. The process kit of claim 6, wherein the cover ring includes a vent passageway.

8. The process kit of claim 1, further comprising a conductive element disposed below the bias power receiver.

9. The process kit of claim 8, wherein the conductive element is flexible and continuous.

10. A process chamber, comprising:
    a substrate support disposed within an inner volume of the process chamber, the substrate support having a deposition ring disposed atop the substrate support;
    a target assembly disposed in the inner volume and comprising a material to be sputtered;
    a process kit disposed about the substrate support, wherein at least a portion of the process kit is disposed above a substrate supporting surface of the substrate support, and wherein the process kit comprises:
       a cover ring having a body and a lip extending radially inward from the body, wherein the body has a bottom, a first wall, and a second wall, and wherein a first channel is formed between the second wall and the lip;
       a grounded shield having one or more sidewalls configured to surround the inner volume and a base that includes a lower inwardly extending ledge that terminates in an upwardly extending portion configured to interface with the first channel of the cover ring;
       a bias power receiver disposed below the lower inwardly extending ledge, coupled to the bottom of the body, and extending through an opening in the base of the grounded shield such that the bias power receiver does not directly contact the grounded shield;
       a dielectric housing disposed about the bias power receiver; and
       a conductive element disposed below the bias power receiver; and
    a conductive rod disposed through a wall of the process chamber and coupled to the conductive element to provide power to the cover ring from a bias power source.

11. The process chamber of claim 10, further comprising a deposition ring disposed about the substrate support.

12. The process chamber of claim 11, wherein a gap of about 5 mm is formed between the lip and the substrate supporting surface.

13. The process chamber of claim 10, further comprising a collimator disposed between the target assembly and the substrate supporting surface.

14. A substrate processing system, comprising:
    a process chamber having an inner volume;
    a target assembly disposed in the inner volume and comprising a material to be sputtered;
    a substrate support disposed within the inner volume;
    an RF power source coupled to the target assembly;
    a process kit disposed about the substrate support, wherein at least a portion of the process kit is disposed above a substrate supporting surface of the substrate support, and wherein the process kit comprises:
       a cover ring having a body and a lip extending radially inward from the body, wherein the body has a bottom, a first wall, and a second wall, and wherein a first channel is formed between the second wall and the lip;
       a grounded shield having one or more sidewalls configured to surround the inner volume and a base that includes a lower inwardly extending ledge that terminates in an upwardly extending portion configured to interface with the first channel of the cover ring;
       a bias power receiver disposed below the lower inwardly extending ledge, coupled to the bottom of the body, and extending through an opening in the base of the grounded shield such that the bias power receiver does not directly contact the grounded shield;

a dielectric housing disposed about the bias power receiver; and a conductive element disposed below the bias power receiver, wherein the bias power receiver contacts the conductive element at least when the cover ring is not resting on the grounded shield;

a first RF bias power source to provide a negative voltage bias to the substrate support;

a second RF bias power source to provide a positive voltage bias to the cover ring; and a conductive rod disposed through an electrical feedthrough on a wall of the process chamber, wherein the conductive rod electrically couples the conductive element to the second RF bias power source.

15. The substrate processing system of claim 14, further comprising an external circuit, electrically interposed between the second RF bias power source and the conductive rod, wherein the external circuit includes a first filter and a second filter.

16. The substrate processing system of claim 15, wherein the first filter blocks RF signals having a frequency of about 13.56 MHz.

17. The substrate processing system of claim 15, wherein the first filter blocks pulsed direct current signals having frequencies from about 4 kHz to about 40 kHz.

18. The substrate processing system of claim 15, wherein the external circuit is housed in an electrical enclosure disposed on an enclosure wall of the process chamber about the electrical feedthrough.

19. The substrate processing system of claim 14, wherein the first RF bias power source provides constant RF current to the substrate support, and wherein the second RF bias power source provides pulsed direct current to the cover ring.

* * * * *